United States Patent
Huang

(10) Patent No.: US 7,429,784 B2
(45) Date of Patent: Sep. 30, 2008

(54) PACKAGE STRUCTURE

(75) Inventor: Cheng Wei Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/627,237

(22) Filed: Jan. 25, 2007

(65) Prior Publication Data

US 2007/0222048 A1    Sep. 27, 2007

(30) Foreign Application Priority Data

Mar. 24, 2006  (TW) .............................. 95110365 A

(51) Int. Cl.
*H01L 23/02* (2006.01)
(52) U.S. Cl. ................... 257/678; 257/686; 257/666; 257/680
(58) Field of Classification Search .......... 257/666–696
See application file for complete search history.

(56) References Cited

U.S. PATENT DOCUMENTS

| 3,815,771 | A | * | 6/1974 | Marks | 215/344 |
| 6,566,745 | B1 | * | 5/2003 | Beyne et al. | 257/680 |
| 6,958,285 | B2 | * | 10/2005 | Siniaguine | 438/459 |
| 7,087,464 | B2 | | 8/2006 | Yu | |
| 2004/0067604 | A1 | * | 4/2004 | Ouellet et al. | 438/108 |

* cited by examiner

*Primary Examiner*—Telly D Green

(57) ABSTRACT

A package structure is provided herein. The package structure includes a first substrate and a second substrate. A first seal ring having a first height is disposed around a predetermined area of the first substrate and between the first and second substrates. A second seal ring having a second height is disposed on the first substrate and around the first seal ring. A sealant is provided between the first and second seal rings to seal up the package structure.

11 Claims, 2 Drawing Sheets

PACKAGE STRUCTURE

CROSS REFERENCE TO RELATED APPLICATION

This application claims the priority benefit of Taiwan Patent Application Serial Number 095110365 filed Mar. 24, 2006, the full disclosure of which is incorporated herein by reference.

BACKGROUND OF THE INVENTION

1. Field of the Invention

The present invention relates to a package structure, and more particularly, to a package structure that has an enhanced adhesion and airtight performance, a reduced usage of applied sealant and can prevent the active region from contamination.

2. Description of the Related Art

As the electronic devices, such as semiconductor devices, MicroElectroMechanical Systems (MEMS) devices and optoelectronic devices are becoming more and smaller, the circuitry therein used to drive these devices gets more compact accordingly. In order to isolate the devices from contamination such as dust, salt, grease or moisture to extend their lifespan and raise the reliability, the devices are required to be packaged so as to execute the functions of power distribution, signal distribution, heat dissipation, protection and support.

Most methods for packaging semiconductor devices are first to dice a wafer into dice and then package these dice into a variety of devices. In contrast, in the wafer-level package method, a wafer is packaged and tested before it is diced. Such a package method can reduce labor costs and shorten the time to make the semiconductor devices. Accordingly, this method is becoming more popular in the field of semiconductor package.

Referring to FIG. 1, it illustrates the cross-sectional view of a conventional electronic package 100. The package 100 includes a substrate 102 and an electronic device 106, such as a MEMS device disposed on the active region 104 of the substrate 102. In order to effectively protect the electronic device 106 from malfunction caused by contamination such as dust or ambient atmosphere, and thus extend its lifespan and raise the reliability, a sealant 112 mixed with spacer balls 110 is applied to the surface of the substrate 102 and around the periphery of the active region 104. A substrate 108 such as a glass substrate is arranged over the electronic device 106 and pressed toward the substrate 102. The two substrates 102, 108 are bonded together via the sealant 112 and the spacer balls 110 dispersed in the sealant 112 can maintain a gap 114 between the two substrates 102, 108 for receiving the electronic device 106.

However, if the spacer balls 110 are of different size or non-uniformly dispersed in the sealant 112, the gap 114 between the two substrates 102, 108 is often non-uniform. The substrates 102, 108 may also be misaligned to each other if the applied force for bonding the substrates 102, 108 together is not uniform and thus cause the spacer balls 110 dispersed in the sealant 112 to roll or slide. Additionally, since the sealant 112 is flowable, the applied force can cause the sealant 112 to flow onto the active region 104 of the substrate 102 when the substrates 102, 108 are bonded together and thus the active region 104 is contaminated. Accordingly, the usage of the sealant 112, the applied force for bonding the substrates 102, 108 together, and the spacer balls 110 can significantly affect the area of the substrate 102 covered by the sealant 112, the gap between the substrates 102, 108, and the alignment of the substrates 102, 108 to each other.

In order to solve the above-mentioned problems, the U.S. Pat. No. 7,087,464 entitled "METHOD AND STRUCTURE FOR A WAFER LEVEL PACKAGING", discloses a plurality of spacer walls formed on a semiconductor wafer or a transparent substrate by semiconductor process. The uniformity of the gap between the semiconductor wafer and the transparent substrate is controlled by these spacer walls. A sealant is applied to the inner sides or outer sides of the spacer walls so as to precisely control the position of the sealant. Accordingly, the distance between the sealant and active region can be significantly shortened and the width of the sealant can also be controlled. Although the method and structure disclosed in the Taiwan Patent Number 1222705 can effectively control the gap between two substrates and prevent the active region from contamination, the sealant is flowable and thus the amount of the sealant applied to the inner sides or outer sides of the spacer walls cannot be precisely controlled. Therefore, the usage of the sealant cannot be reduced, and the adhesion and airtight performance is still poor.

In view of the above, there exists a need to provide a package structure that has a uniform gap between two substrates and a good airtight seal so as to extend its lifespan and raise the reliability. Additionally, the package structure is required to be manufactured in the wafer-level package method in order to reduce the production cost.

SUMMARY OF THE INVENTION

It is an object of the present invention to provide a package structure that can significantly reduce the usage of the sealant for bonding two substrates thereof together.

It is another object of the present invention to provide a package structure that can not only effectively control the distribution of the sealant but also prevent the sealant from contaminating the active region.

It is a further object of the present invention to provide a package structure that has an enhanced adhesion and airtight performance so as to effectively isolate the device therein from dust or moisture. The lifespan and reliability of the device can therefore be extended significantly.

In order to achieve the above objects, the package structure according to the present invention includes a first substrate and a second substrate, wherein the upper surface of the first substrate defines a predetermined area. A first seal ring of a first height is disposed on the upper surface of the first substrate and around the periphery of the predetermined area. The first seal ring connects with the lower surface of the second substrate. A second seal ring having a second height smaller than the first height is disposed on the upper surface of the first substrate and around the first seal ring. The area enclosed between the first and second seal rings defines a channel. A sealant is disposed in the channel.

The package structure according to another embodiment of the present invention includes a first substrate and a second substrate, wherein the upper surface of the first substrate defines a predetermined area. A first seal ring of a first height is disposed on the upper surface of the first substrate and around the periphery of the predetermined area. The first seal ring connects with the lower surface of the second substrate. A second seal ring having a second height smaller than the first height is disposed on the upper surface of the first substrate and around the first seal ring. The area enclosed between the first and second seal rings defines a channel. A third seal ring is disposed on the lower surface of the second substrate and corresponding to the channel. A sealant is disposed in the channel.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
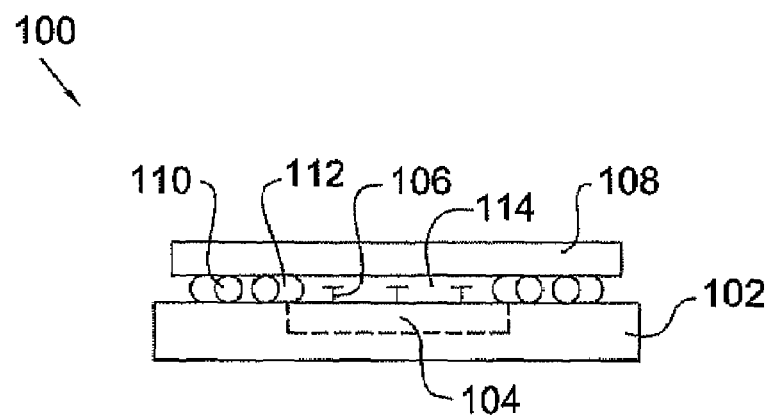
FIG. 1 is a cross-sectional view of a conventional electronic package.

While the present invention is susceptible of embodiment in various forms, there is shown in the drawings and will hereinafter be described a presently preferred embodiment with the understanding that the present disclosure is to be considered an exemplification of the invention and is not intended to limit the invention to the specific embodiment illustrated.

Figure 2:
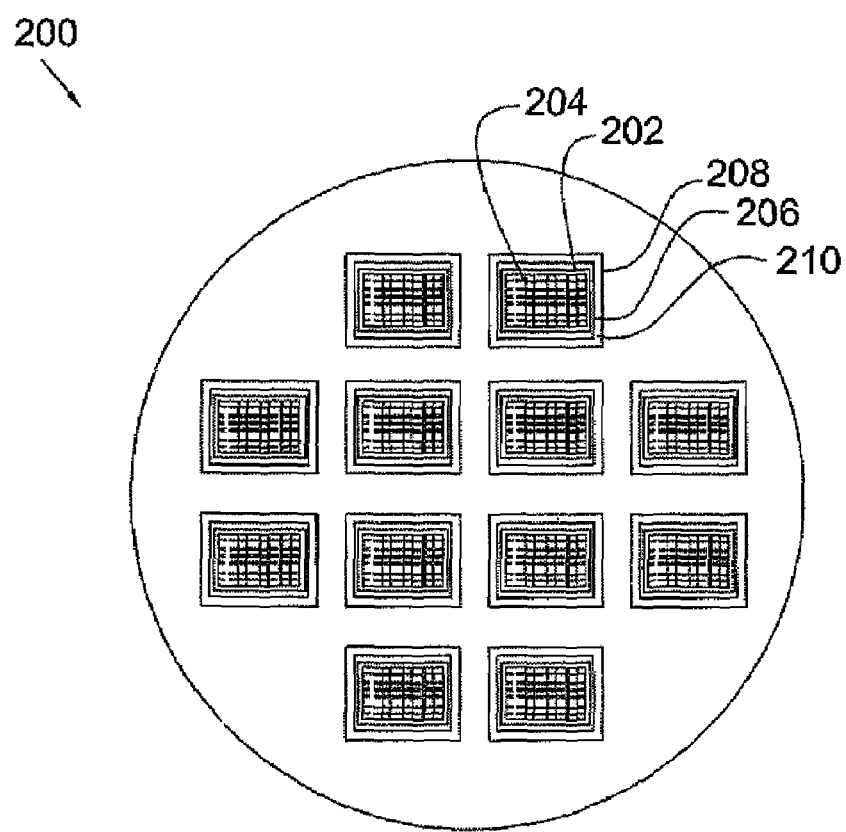
FIG. 2 is a top view of a substrate according to an embodiment of the present invention.

Referring to FIG. 2, it illustrates the top view of a substrate 200 according to an embodiment of the present invention. The substrate 200 such as a semiconductor wafer has an upper surface defining at least one predetermined area 202. At least one device 204 is disposed on the predetermined area 202. Therefore, the predetermined area 202 can be referred to as a device area. The device 204 can be a semiconductor device, MEMS device, optoelectronic device or other electronic devices.

In this embodiment, the device 204 is a CMOS device/ MEMS device as an exemplary example to this embodiment. A first seal ring 206 is disposed on the substrate 200 and around the periphery of the predetermined area 202 provided with the device 204 thereon. A second seal ring 208 is disposed on the substrate 200 and around the first seal ring 206. The area enclosed between the first and second seal rings 206, 208 defines a channel 210. In order to form the first and second seal rings 206, 208, a plating film is first formed on the substrate 200 in the process, such as electroless plating process, evaporation process, sputtering process or chemical vapor deposition (CVD) process, and then a photoresist is disposed on the plating film and patterned by a semiconductor process. Finally, the plating film is plated to form the first and second seal rings 206, 208. The seal rings 206, 208 can be made of metal, such as copper or of ceramics, such as silicon oxide. Additionally, one of ordinary skill in the art can form the seal rings 206, 208 by attaching rings to the substrate 200 and the seal rings 206, 208 can be made of the same material or different materials.

Figure 3:
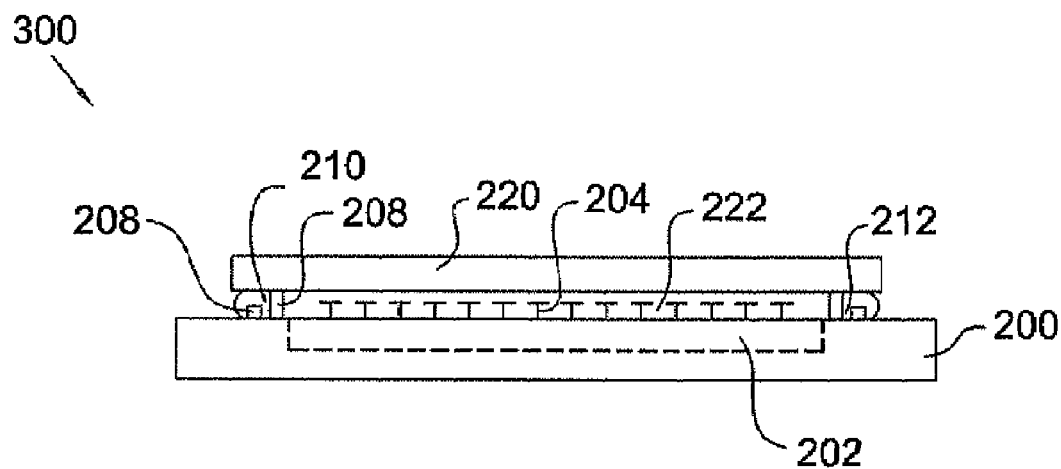
FIG. 3 is a cross-sectional view of a package structure according to an embodiment of the present invention.

Referring to FIG. 3, it illustrates the cross-sectional view of a package structure 300 of this embodiment. The first seal ring 206 has a first height and the second seal ring 208 has a second height small than the first height. In this embodiment, a sealant 212 is first provided in the channel 210. The channel 210 formed between the first and second seal rings 206, 208 can effectively control the usage and distribution of the flowable sealant 212 provided therein to prevent the excessive sealant 212 from overflowing onto the device area 202.

In this embodiment, the sealant 212 provided in the channel 210 preferably has a slightly greater height than the first height of the seal ring 206 as a result of cohesion so that a substrate 220 can easily bond to and form an airtight seal with the substrate 200 by the sealant 212 when the substrate 220 is disposed over the substrate 200 to cover the device 204. In order to receive the devices 204 of different sizes, the gap 222 between the substrates 200, 220 is required to be adjusted and this can be achieved by changing the first height of the first seal ring 206. Additionally, since the second height of the second seal ring 208 is smaller than the first height of the first seal ring 206, the excessive sealant 212 in the channel 210 can overflow from the top of the second seal ring 208 when the substrate 220 is brought into adhesion to the substrate 200. Accordingly, the excessive sealant 212 will not overflow onto the device area 202 to contaminate the device 204, as seen in FIG. 3. In this embodiment, the device 204 in the package structure 300 is an optoelectronic device and thus the substrate 220 is a transparent substrate, such as a glass substrate. However, the invention is not limited by the above described embodiment.

Figure 4:
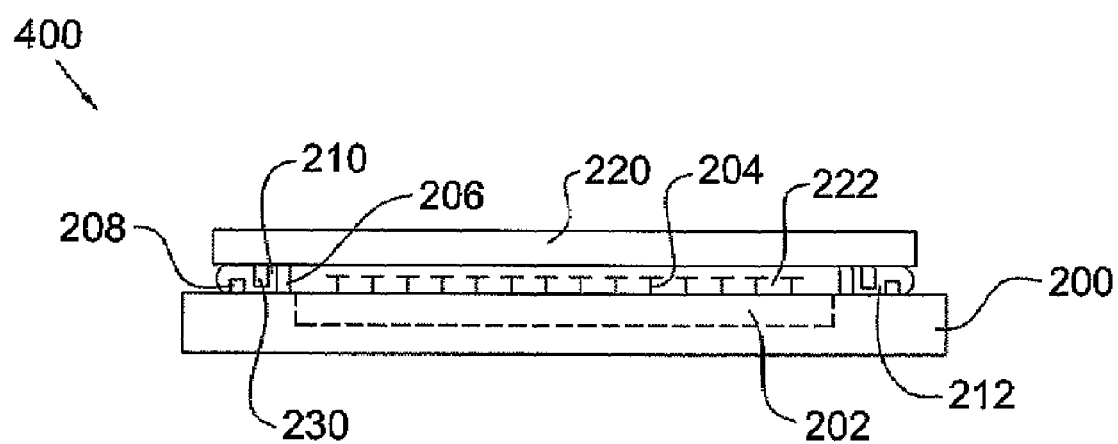
FIG. 4 is a cross-sectional view of a package structure according to another embodiment of the present invention.

FIG. 4 is the cross-sectional view of a package structure 400 according to another embodiment of the present invention, where identical reference numerals have been used when designating substantially identical elements that are common to the figures. Thus, any further illustrations of the identical elements are omitted herein.

Referring to FIG. 4, a third seal ring 230 is disposed on the lower surface of the substrate 220 and corresponding to the channel 210 disposed on the upper surface of the substrate 200. Preferably, the third seal ring 230 has a third height smaller than the first height of the first seal ring 206. Since the third seal ring 230 occupies a portion of the channel 210, the excessive sealant 212 provided in the channel 210 will be forced to overflow from the top of the second seal ring 208 when the substrate 220 is brought into adhesion to the substrate 200. In this embodiment, as the third seal ring 230 protrudes into the channel 210, the usage of the sealant 212 for bonding the substrates 200, 220 together can be reduced accordingly. Additionally, the substrate 220 can more strongly bond to and form an airtight seal with the substrate 200 since the introduction of the third seal ring 230 increases the area contacting with the sealant 212.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A package structure, comprising:

a first substrate having an upper surface, the upper surface of the first substrate defining a predetermined area;

a second substrate having a lower surface, disposed above the first substrate;

a first seal ring having a first height, disposed on the upper surface of the first substrate and around the periphery of the predetermined area, the first seal ring connecting with the lower surface of the second substrate;

a second seal ring having a second height smaller than the first height, disposed on the upper surface of the first substrate and around the first seal ring, wherein the area enclosed between the first and second seal rings defines a channel; and a sealant disposed in the channel.

2. The package structure as claimed in claim 1, further comprising:

at least one device disposed on the predetermined area.

3. The package structure as claimed in claim 2, wherein the second substrate is transparent.

4. The package structure as claimed in claim 2, wherein the second substrate is a glass substrate.

5. A package structure, comprising:

a first substrate having an upper surface, the upper surface of the first substrate defining a predetermined area;

a second substrate having a lower surface, disposed above the first substrate;

a first seal ring having a first height, disposed on the upper surface of the first substrate and around the periphery of the predetermined area, the first seal ring connecting with the lower surface of the second substrate;

a second seal ring having a second height smaller than the first height, disposed on the upper surface of the first substrate and around the first seal ring, wherein the area enclosed between the first and second seal rings defines a channel;

a third seal ring having a third height, disposed on the lower surface of the second substrate and corresponding to the channel; and a sealant disposed in the channel.

6. The package structure as claimed in claim 5, wherein the third height is smaller than the first height.

7. The package structure as claimed in claim 5, further comprising:

at least one device disposed on the predetermined area.

8. The package structure as claimed in claim 7, wherein the second substrate is transparent.

9. The package structure as claimed in claim 7, wherein the second substrate is a glass substrate.

10. The package structure as claimed in claim 2, wherein the device is selected from the group consisting of semiconductor device, MEMS device and optoelectronic device.

11. The package structure as claimed in claim 7, wherein the device is selected from the group consisting of semiconductor device, MEMS device and optoelectronic device.

* * * * *